United States Patent [19]
Gorowitz et al.

[11] Patent Number: 5,757,072
[45] Date of Patent: May 26, 1998

[54] STRUCTURE FOR PROTECTING AIR BRIDGES ON SEMICONDUCTOR CHIPS FROM DAMAGE

[75] Inventors: Bernard Gorowitz, Clifton Park; Charles Adrian Becker, Schenectady; Renato Guida, Wynantskill; Thomas Bert Gorczyca, Schenectady; James Wilson Rose, Guilderland, all of N.Y.

[73] Assignee: Martin Marietta Corporation, King of Prussia, Pa.

[21] Appl. No.: 663,506

[22] Filed: Jun. 14, 1996

Related U.S. Application Data

[62] Division of Ser. No. 359,128, Dec. 19, 1994, Pat. No. 5,561,085.

[51] Int. Cl.⁶ .............. B23K 26/00; H05K 3/30; H01L 29/34; H01L 23/48
[52] U.S. Cl. .............. 257/700; 257/725; 257/758; 257/659; 257/684; 257/723; 257/704; 257/522; 361/795
[58] Field of Search ............... 257/690, 728, 257/659, 758, 723, 724, 778, 678, 684, 700, 685, 704, 725, 522, 776; 29/841, 840, 832; 361/795

[56] References Cited

U.S. PATENT DOCUMENTS

| | | | |
|---|---|---|---|
| 5,049,978 | 9/1991 | Bates et al. | 257/728 |
| 5,073,814 | 12/1991 | Cole, Jr. et al. | 257/758 |
| 5,151,769 | 9/1992 | Immorlica, Jr. et al. | 257/659 |
| 5,359,496 | 10/1994 | Kornrumpf et al. | 361/795 |
| 5,524,339 | 6/1996 | Gorowitz et al. | 437/209 |
| 5,548,099 | 8/1996 | Cole, Jr. et al. | 437/209 |

*Primary Examiner*—Tom Thomas
*Assistant Examiner*—Alexander Oscar Williams
*Attorney, Agent, or Firm*—Geoffrey H. Krauss

[57] ABSTRACT

A protective cap is deposited over the top and sides of an air bridge structure located on an integrated circuit chip. The protective cap provides mechanical strength during the application of a high density interconnect structure over the chips, to prevent deformation of the sensitive (air bridge) structure, and also to prevent any contamination from intruding under the air bridge. More importantly, the protective cap does not impede the performance of the air bridge and therefore does not need to be removed, thereby eliminating the necessity of ablating the HDI structure. Furthermore, the protective cap allows additional area for metallization to provide alternate circuits for coupling, power or ground planes, etc.

9 Claims, 4 Drawing Sheets

STRUCTURE FOR PROTECTING AIR BRIDGES ON SEMICONDUCTOR CHIPS FROM DAMAGE

This is a division of application Ser. No. 08/359,128, filed Dec. 19, 1994, now U.S. Pat. No. 5,541,085.

BACKGROUND OF THE INVENTION

This invention relates generally to protection of a sensitive structure forming part of a semiconductor device, such as an integrated circuit used in a high density interconnect structure, and more particularly to the packaging of high speed devices having sensitive structures such as air bridge structures, with a protective cap, which after lamination and formation of the high density interconnect structure, may be left in place. Furthermore, this cap provides for extra routing of metallized interconnections which can enhance the performance of the chips. Use of this cap leaves the air bridge protected, and its performance unaffected in a device, and can be used in a module without requiring removal or modification of the high density interconnect (HDI) structure.

High performance is often obtained by the use of high speed semiconductor devices such as those fabricated from gallium arsenide (GaAs). These high speed devices may have delicate structures which can easily be damaged or destroyed during fabrication. These include conductors which are spaced from the surface of the GaAs, or other suitable semiconductor material, by an air gap—a structure which is known as an air bridge. Air bridges are used in these devices to provide improved signal propagation and reduced capacitive coupling over that possible with conventional fabrication methodologies. In the fabrication of certain multi-chip module (MCM) circuits using GaAs or other air bridge-containing devices, the sensitive structure must be protected when the HDI wiring structure is being fabricated.

The interconnect structure used in the fabrication of high density interconnect (HDI) circuits has many advantages in the compact assembly of MCMs. For example, a multi-chip electronic system (such as a microcomputer incorporating 30–50 chips) can be fully assembled and interconnected by a suitable HDI structure on a single substrate, to form a unitary package which is 2 inches long by 2 inches wide by 0.050 inches thick. Even more important, the interconnect structure can be disassembled from the substrate for repair or replacement of a faulty component and then reassembled without significant risk to the good components incorporated within the system. This is particularly important where many (e.g., 50) chips, each being very costly, may be incorporated in a single system on one substrate. This repairability feature is a substantial advance over prior connection systems in which reworking the system to replace damaged components was either impossible or involved substantial risk to the good components.

Briefly, in this high density interconnect structure, a ceramic substrate such as alumina which may be 50–100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. The cavity bottom may be made respectively deeper or shallower at a location where a particularly thick or thin component will be placed, so that the upper surface of the corresponding component is in substantially the same plane as the upper surface of the rest of the components and the portion of the substrate which surrounds the cavity. The bottom of the cavity is then provided with a thermoplastic adhesive layer, which may preferably be a polyetherimide resin (such as ULTEM® 6000 resin, available from the General Electric Company, Fairfield, Conn.), or an adhesive composition such as is described in U.S. Pat. No. 5,270,371, herein incorporated in its entirety by reference. The various components are then placed in their desired locations within the cavity and the entire structure is heated to remove solvent and thermoplastically bond the individual components to the substrate.

Thereafter, a film, which may be "KAPTON®" polyimide, (available from E. I. du Pont de Nemours Company, Wilmington, Del.), of a thickness of approximately 0.0005–0.003 inches (approx. 12.5–75 microns), is pretreated by reactive ion etching (RIE) to promote adhesion. The substrate and chips must then be coated with ULTEM® 1000 polyetherimide resin or another thermoplastic adhesive to adhere the KAPTON® resin film when it is laminated across the tops of the chips, any other components and the substrate. Thereafter, via holes are provided (preferably by laser drilling) through the KAPTON® resin film, and ULTEM® resin layers, at locations in alignment with the contact pads on the electronic components to which it is desired to make contact. A multi-sublayer metallization layer, with a first sublayer comprising titanium (approximately 1000 Å) and a second layer comprising copper (approximately 2000 Å), is sputter deposited over the KAPTON® resin layer and extends into the via holes to make electrical contact to the contact pads disposed thereunder. The sputtered copper provides a seed layer for copper electroplating (3 to 4 microns thick). A final layer of titanium (1000 Å) is sputter deposited to complete the Ti/Cu/Ti multilayer metallization. This metallization layer is patterned to form individual conductors using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the patents and applications listed hereinafter.

This high density interconnect structure provides many advantages. Included among these are the lightest weight and smallest volume packaging of such an electronic system presently available. A further, and possibly more significant, advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling; this process is straight-forward and fairly rapid.

The high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 5,127,998, entitled "Area-Selective Metallization Process" by H. S. Cole et al.; U.S. Pat. No. 5,127,844, entitled "Area-Selective Metallization Process" by H. S. Cole, et al.; U.S. Pat. No. 5,169,678, entitled "Locally Orientation Specific Routing System" by T. R. Haller, et al.; and U.S. Pat. No. 5,108,825, entitled "An Epoxy/Polyimide Copolymer Blend Dielectric and Layered Circuits Incorporating It" by C. W. Eichelberger, et al; U.S. Pat. No. 5,300,812, entitled "Plasticized Polyetherimide Adhesive Composition and Usage" by Lupinski et al. Each of these Patents and Patent Applications, including the references contained therein, is hereby incorporated in its entirety by reference.

This high density interconnect structure has been developed for use in interconnecting semiconductor chips to form digital systems. That is, for the connection of systems whose operating frequencies are typically less than about 50 Mhz, which is low enough that transmission line, other wave impedance matching and dielectric loading effects have not needed to be considered.

The interconnection of structures or devices intended to operate at very high frequencies presents many challenges not faced in the interconnection of digital systems. For example, use of gigahertz frequencies requires consideration of wave characteristics, transmission line effects and material properties. Also, use of high frequencies requires the consideration of the presence of exposed delicate structures on MCMs and other components and system and component characteristics which do not exist at the lower operating frequencies of such digital systems.

As stated above, the interconnect structure used in the fabrication of HDI circuits is created from alternating layers of laminated dielectric films and patterned metal films. In the process of laminating the dielectric layers, the adhesive used to bond the dielectric layers is caused to flow and form a quality, void-free interface. There is a substantial concern that air bridges and other sensitive structures may be modified, damaged or destroyed by the lamination pressure. Also, these sensitive structures may be overlay sensitive, i.e., the operating characteristics of the device or component may be different when the device or component is free of interconnection dielectric material than when these devices have high density interconnect dielectric layers disposed directly over them. Lamination as well as other processing steps may also cause the thermoplastic adhesive to infiltrate the air gap under the conductor, thereby modifying the dielectric properties of that gap.

Since there are sensitive structures present, low temperature processing is needed to ensure that these structures are not damaged during multi-chip module fabrication. For example, chips of certain semiconductors (GaAs, InSb and HgCdTe), as well as the structures on these chips, e.g., air bridges, are very sensitive to processing in high temperature regimes. Multichip modules incorporating a high density interconnect structure, as well as GaAs chips containing sensitive structures, must typically be fabricated at temperatures below about 260° C.

To maintain the performance advantage of having air, or some other electrical insulator, as the dielectric medium, the MCM fabrication process must be designed to provide a means of preserving these air bridge structures from intrusion by other materials.

For example, related U.S. Pat. No. 5,355,102, entitled, "High Density Interconnected Microwave Circuit Assembly", by W. P. Kornrumpf et al., teaches removing the high density interconnect dielectric from portions of the chip which are overlay sensitive. That is, after the HDI structure is laminated, the portion of the HDI structure overlying the sensitive structure is removed by ablation. Removing the HDI structure improves the performance of the sensitive structure, e.g., air bridge, because there is no overlying material. However, ablating the overlying material does not remove all of the adhesive which may flowed under the bridge during prior processing; nor does it compensate for the effects of the lamination pressure which can occasionally damage or even collapse the air bridge. As will be discussed hereinbelow, removing the HDI structure over the sensitive structure also decreases the area available for routing the electrical conductors within the HDI structure and severely restricts the potential usefulness of the HDI technique. This patent application, including the references contained therein, is hereby incorporated in its entirety by reference.

Related U.S. Pat. No. 5,331,203, filed Apr. 5, 1990, by Wojnarowski et al., and entitled "A High Density Interconnect Structure Including a Chamber" teaches bonding the chip containing a sensitive structure into a deep chip-well. Since the chip-well is deeper than the chip is thick, there is a space created over the surface of the chip. A first dielectric layer is laminated such that this layer is only attached to a plateau portion of the substrate and to the upper surface of the chip. This first dielectric layer is not applied over the sensitive structure. Then, the remainder of the HDI structure is laminated, thereby creating a "chamber" of air over the sensitive structure. If successfully laminated, this technique creates a space over the sensitive structure to allow it to work properly. However, in practice this lamination procedure is very difficult to reproduce without damaging the sensitive structure. Because the second dielectric layer has adhesive, it is still difficult to produce a module where the adhesive from this layer does not infiltrate the space under the air bridge. Furthermore, because the chip is in a deep chip-well it is difficult to make electrical contact with the chip pads through the via holes with the metallization layer within the high density interconnect structure. This patent application, including the references contained therein, is hereby incorporated in its entirety by reference.

Related U.S. Pat. No. 5,338,975, entitled "High Density Interconnection Including a Spacer and a Gap", by Cole et al, teaches applying spacers over the contact pads present on the integrated circuit chips, and then stretching the first HDI dielectric layer over these spacers such that the dielectric layer does not contact the chip surface. This application provides a method of fabricating a HDI module incorporating a sensitive chip structure without the dielectric layer of the high density interconnect structure inhibiting the chip's performance. However, since the adhesive from the first dielectric layer is designed to flow and form a void free layer, it may contaminate any sensitive structure which is placed between the spacers. Also, because the high density interconnect structure is supported only by the spacers, there may be difficulties with the dielectric layers sagging and causing interruptions in the metallization layers. This patent application, including the references contained therein, is hereby incorporated in its entirety by reference.

Related application Ser. No. 08/046,299, allowed Oct. 7, 1994, entitled "High Density Interconnection of Substrates and Integrated Circuit Chips containing Sensitive Structures", to Cole et al. teaches laying down a solvent soluble layer to "protect" the air bridge during lamination of the HDI structure. Once the module is fully worked-up, the HDI structure which overlays the sensitive structure is ablated away and the module is immersed in a solvent to remove the protective layer. This method, although very labor intensive, inhibits damage to the air bridge and prohibits the adhesive from getting under the bridge during lamination of the high density interconnect structure. This patent application, including the references contained therein, is hereby incorporated in its entirety by reference.

Unfortunately, the teaching disclosed in the last-mentioned application suffers from the disadvantage that the need to exclude the high density interconnect structure from the surface of overlay-sensitive components severely restricts the surface area available for the routing of the high density interconnect structure metallization layers since they cannot be routed over the area from which the dielectric layer is to be removed. Where chips are closely packed for maximum density, this essentially limits the high density interconnect structure to the routing of conductors in the "streets" and "avenues" portion of the structure which extends from the contact pads of one chip to the contact pads of the adjacent chip. For systems where high density of interconnect conductors is required, such a restriction can require excessive numbers of layers of interconnect conductors, require that the chips be spaced further apart than would otherwise be necessary, or even make a system unroutable.

Co-pending application Ser. No. 08/308,886, filed Sep. 19, 1994, entitled "Method for Protecting Gallium Arsenide MMIC Air Bridge Structures", to Gorowitz et al. teaches depositing a carbon layer to "protect" the air bridge during lamination of the HDI structure. After the HDI interconnect structure is completed, the HDI structure over the sensitive area on the chip may be ablated and the protective layer removed. This may not be necessary, however, since this protective layer does not significantly impinge under the air bridge, and therefore, may not affect the chips electrical performance. This patent application, including the references contained therein, is hereby incorporated in its entirety by reference.

Consequently, an improved method for protecting sensitive structures during HDI structure lamination which does not impede the function of an air bridge, or the routing of the metallization layers within the HDI structure, and which further provides additional metallization routing area, is desirable.

OBJECTS OF THE INVENTION

Accordingly, a primary object of the invention is to provide a novel means for protection of sensitive structures of a semiconductor device in a manner such that the protection means does not substantially interfere with the device operation.

Another object is to provide multi-chip modules fabricated with undamaged air bridges in a manner which does not require removal of any portion of an overlying high density interconnect structure, and further which allows for additional metallization routing area.

SUMMARY OF THE INVENTION

Briefly, according to the invention, a method for preserving an air bridge structure on a semiconductor device, includes the step of applying a protective cap over the air bridge. The protective cap is bonded to the device surface and creates a volume over and around the air bridge which provides mechanical strength, thereby protecting the air bridge from any subsequent damage. When the device is a semiconductor chip secured to a substrate, the cap protects the sensitive structure during lamination of a high density interconnect structure. The protective cap also prevents contaminants from intruding under the air bridge during HDI lamination, and provides additional surface area for routing metallization. This additional metallization allows for alternate circuits to be laid for coupling, power or ground planes. More importantly, the protective cap does not affect the performance of the air bridge and therefore does not need to be removed, thereby eliminating the necessity of removing or modifying the overlying HDI structure.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which:

FIGS. 3(a)–(e) are cross-sectional views of a polyimide protective cap at various progressive stages of fabrication and attachment to a chip within a multi-chip module substrate.

DETAILED DESCRIPTION

Figure 1:
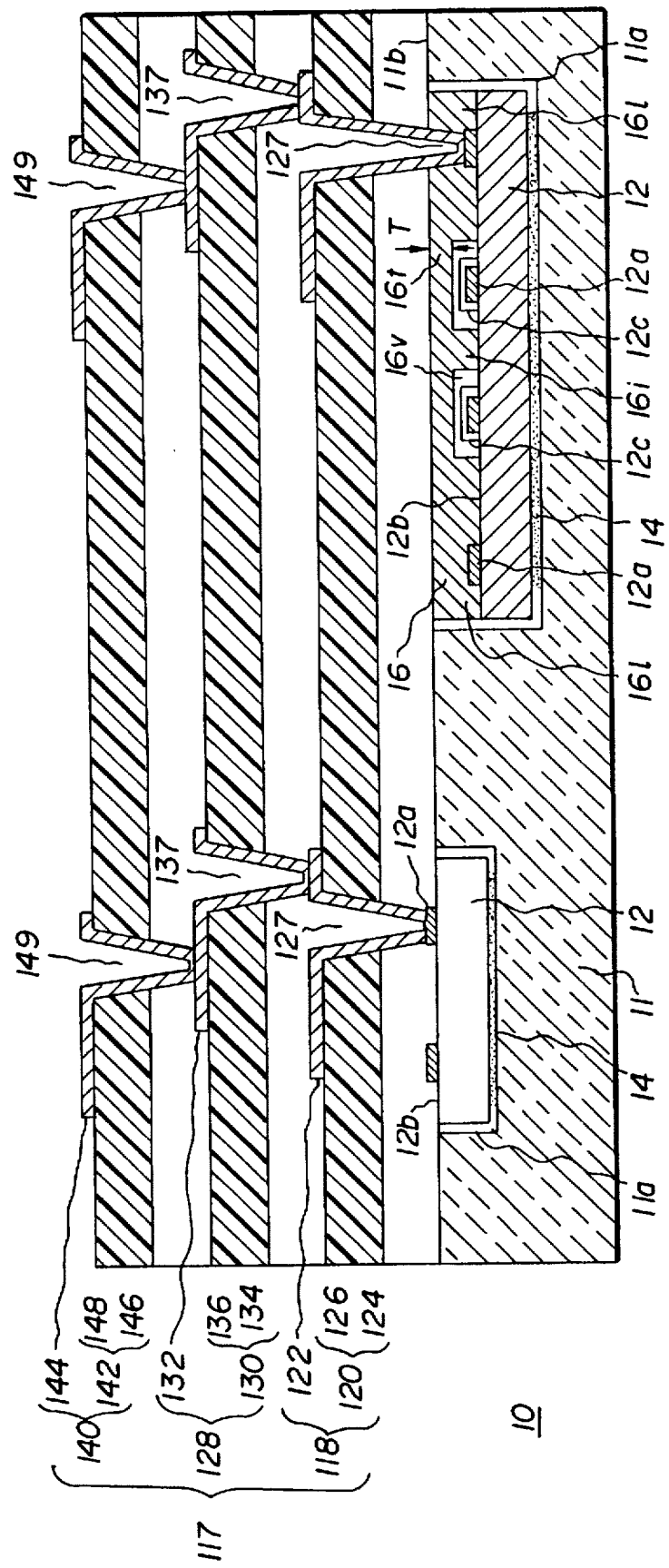
FIG. 1 is a cross-sectional view of a multi-chip module having a chip with an air bridge structure enclosed with a polymer protective cap to provide mechanical support during processing.
Figure 2:
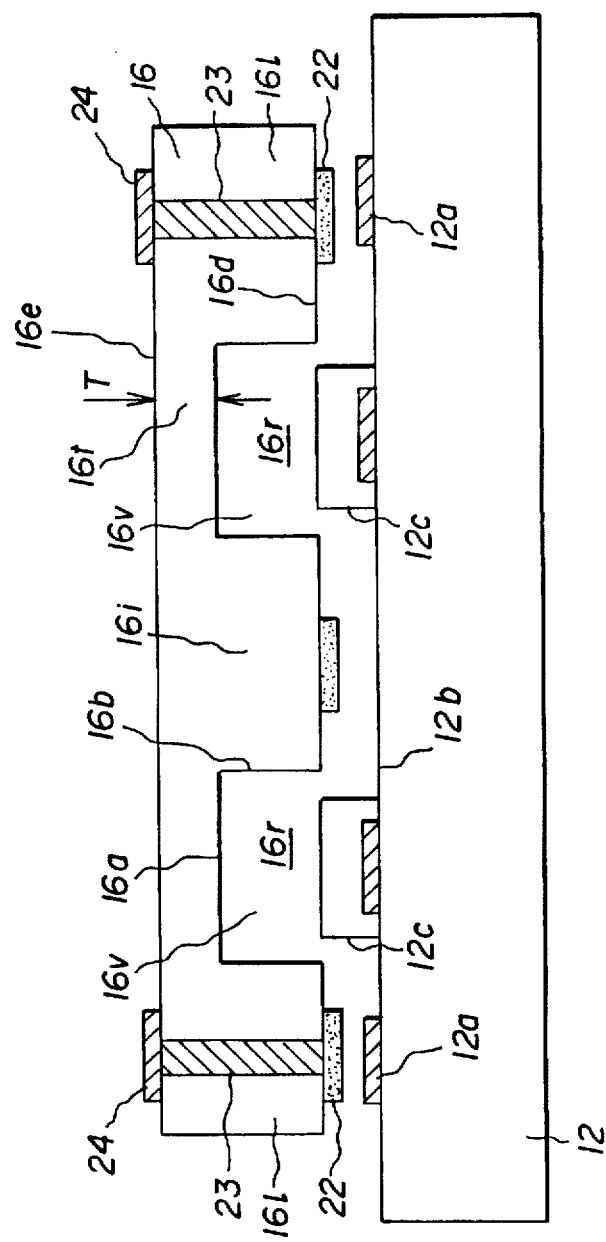
FIG. 2 is a cross-sectional view of a ceramic protective cap and of a semiconductor device (e.g. a chip) with which the cap may be used.

Referring initially to FIGS. 1 and 2, a multichip module 10 has a substrate 11 with a plurality of chip cavities 11a formed therein, through a top surface 11b thereof. An electronic component 12 such as an integrated circuit chip and the like, is disposed in each chipwell 11a. Electronic components 12 may be bonded to the substrate 11 with a layer of a thermoplastic adhesive 14. The electronic components 12 have contact pads 12a on an upper contact surface 12b thereof. Some of these electronic components 12 also have at least one sensitive structure 12c, such as an air bridge and the like, on upper surface 12b.

In accordance with the invention, a protective cap 16 is bonded to the component upper surface 12b, and has a recess 16r which surrounds, but does not touch the sensitive structure 12c to create an encapsulating volume 16v. Protective cap 16 is a protective "shield" structure comprising a cover-portion 16t having a top surface 16e and a bottom surface 16d, and a peripheral leg-portion 16l extending from the cover-portion bottom surface 16d to component surface 12b. Cover-portion 16t and leg-portion 16l cooperate to define a "U shaped" recess 16r. Recess 16r aligns with an associated sensitive structure 12c when the protective cap 16 is bonded to the device surface 12b. Once bonded to the device 12, protective cap 16 covers the sensitive structure 12c on those sides (and top) not covered by the underlying chip 12, creating encapsulation volume 16v. Encapsulation volume 16v is large enough to ensure there is no contact between protective cap 16 and sensitive structure 12c, such that during lamination of the overlying HDI structure, the air bridge structure 12c is not damaged. Furthermore, the encapsulation volume 16v ensures that protective cap 16, as well as the overlying HDI structure, will not inhibit or impede the performance of sensitive structure 12c.

If more than one sensitive structure 12c is present on chip 12, there may be an internal leg-portion 16i to support the cover-portion 16t as it spans the plural (e.g. two) sensitive structures 12c. Because protective cap 16 is designed to work in a multi-chip module 10 incorporating a high density interconnect structure 117, size limitations must be met. The protective cap 16 must not be so thick as to impede the lamination of the overlying HDI structure 117. However, the protective cap 16 will have some nominal thickness T which will extend above the air bridge structure 12c. Therefore, the chip well 11a in which the air bridge containing chip 12, with attached cap 16, is stationed, should be milled to a greater depth to offset this added thickness. Generally speaking, the protective cap 16 may be of two designs: a rigid ceramic or glass design, or a more flexible polyimide design.

A first embodiment of protective cap 16 is illustrated in FIG. 2, where the cap 16 may be comprised of high temperature polymers, ceramics, such as alumina, aluminum nitride, etc., or glasses. Any insulative material which can withstand the temperature and pressure constraints of the HDI-structure lamination process is suitable for use as a protective cap 16. The first embodiment of protective cap 16 has recesses 16r which may be milled or formed through any conventional milling of molding techniques. Recesses 16r will be aligned with the air bridge structures 12c when protective cap 16 is attached to chip surface 12b. When protective cap 16 is bonded to chip surface 12b, each recess 16r creates an associated encapsulating volume 16v. Each encapsulating volume 16v includes the recess 16r within protective cap 16, as defined by the protective cap recess top 16a, the cap walls 16b and the chip surface 12b; encapsulation volume 16v also includes a lower surface defined by chip surface 12b and structure 12c, all of which are substantially devoid of HDI material. The protective cap 16 of FIG. 2 is bonded to the chip contact surface 12b by any suitable conductive adhesive material 22. This conductive adhesive suitable for use with the ceramic style protective cap 16 may be solder bumps, a conductive epoxy or any other suitable material which can electrically bond the cap 16 to the chip pads 12a on the chip surface 12b while at the same time provide electrical conductivity for later HDI interconnection.

To provide for electrical interconnection to the HDI structure, the first embodiment of protective cap 16 must have conductive posts 23 to provide for electrical conductivity from the bottom of the cap 16d to the top of the cap 16e. Posts 23 may be formed by etching through the thickness of the cap 16 in the associated leg-portion 16l (shown) or 16i (not shown) and then filling the etched holes with a conductive material, or may be made by forming the protective cap around a conductive post, i.e., molding a polymer around a copper wire post. It should be noted that as the thickness of the cap increases to greater than around 5 mils, it is difficult to form (etch or laser drill) a hole of small dimensions, such as 1 mil. As this aspect ratio increases, it is also difficult to fill a drilled or etched hole with a conductive material either by sputter deposition or by electroplating. An alternative is to partially drill the greater length of the hole (top of the cap) to one diameter, e.g., about 2 to 6 mils, and then drill the shorter length, e.g., about 1 to 2 mils, to the smaller desired diameter, e.g., about 1 mil. This improves the ability to place sputtered and/or plated metal in these holes. However, the spacing between the chip pads will ultimately determine the maximum diameter of the holes in the top of the cap.

Ceramics, glasses or other such brittle compositions, tend to crack as their thicknesses decrease and are therefore not preferred cap 16 materials. Because recesses 16r in the design of the ceramic protective cap 16 create high stress points, trying to keep the thickness at a minimum, while ensuring structural integrity of the protective cap 16, is a non-trivial task. Therefore, this design is not the preferred embodiment.

FIGS. 3(a)–(e) show the various fabrication stages of a second, and presently preferred, protective cap design, as well as illustrating the manner of attachment of the cap to the chip. The presently preferred protective cap 16 is fabricated from a polymer sheet by the following process. A carrier substrate 20 is precleaned by removing any contamination from at least one of its surfaces 20a and an adhesion promoter (not shown) may be added to surface 20a to achieve improved adhesion. Although substrate carrier 20 is preferably quartz for the reasons described hereinbelow, it is to be understood that any substrate material, e.g., plastic, ceramic, metal or glass, may be utilized. A release layer 26 is then deposited on substrate carrier surface 20a. A dielectric film 28 is then deposited on release layer 26. Dielectric film 28 may be applied from solution through spinning or spraying, or may be laminated by conventional techniques.

Dielectric film 28 can be made from any number of materials which have a coefficient of thermal expansion matching that of the multichip module. A preferred material, for spin or spray application, is "PI-2611 Low Stress Polyimide", available from E. I. Du Pont De Numeours Co., Wilmington Del. Preferred materials for lamination include "Kapton-E®" also available from Du Pont, and "UBE Upilex" polyimide films, available from UBE Industries Ltd., Tokyo, Japan. Release layer 26 is "the adhesive" for lamination of dielectric film 28. As such, release layer 26 should be selected to both help bond dielectric film 28 to carrier substrate 20 and to permit subsequent release of dielectric layer 28 from carrier substrate 20.

The upper bare surface 28a of dielectric film 28 is then prepared for application of an adhesive layer 30 by techniques such as reactive ion etching (RIE), a propanol jet scrub, or application of an adhesion promoter. Adhesive layer 30 is then applied to this "prepared" dielectric film 28. As will be shown below, adhesive material 30 is selected to provide sufficient flow such that when it is bonded to chip surface 12b, a void free interface will form, but there will not be significant flowing of adhesive 30. Therefore, there will be no flowing of adhesive material 30 into any air bridge 12c regions. Blends of "Ultem 1010" polyimide, available from the General Electric Company, Pittsfield Mass. and "Oxysim" polyimidesiloxane, available from Occidental Chemical Corp., Grand Island, N.Y. in a range from 50/50 to 95/5 have the desired melt viscosity for this purpose.

Figure 3A:
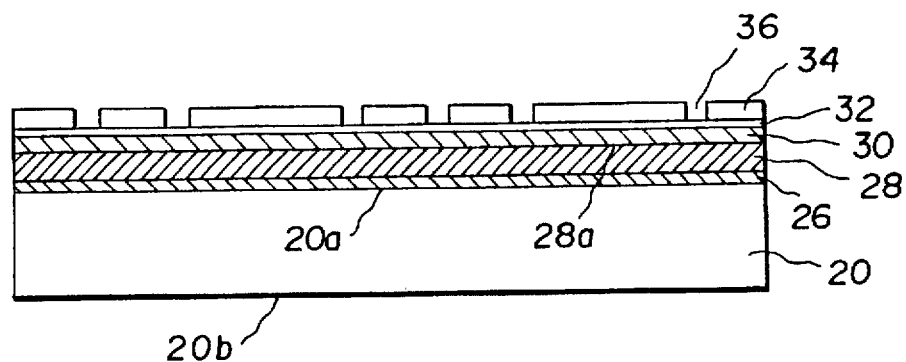
Figure 3B:
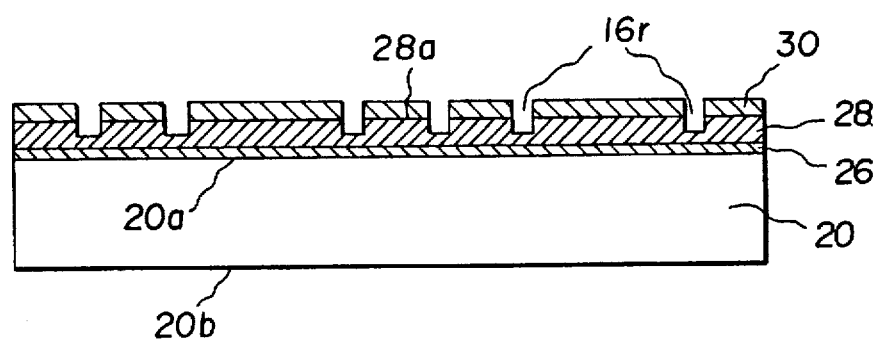

Adhesive layer 30 is then patterned with conventional photolithographic methods to allow subsequent removal of portions of adhesive layer 30, as well as portions of underlying dielectric layer 28. These removed regions, or recesses 16r will correspond to air bridge regions 12c when cap 16 is bonded to chip surface 12b. For example, one method for patterning these materials to deposit a "hard" mask layer 32, such as a sputtered film of 1000 Å Titanium and 5000 Å copper, deposit a layer of photoresist 34 which is subsequently patterned 36. This built-up structure with patterned photoresist is shown in FIG. 3(a). Mask Layer 32 can then be etched away where photoresist 34 was patterned 36, leaving adhesive layer 30 exposed. Photoresist 34 is then removed, and reactive ion etching, or any other appropriate method may be used to remove the exposed regions of adhesive layer 30, and a portion of dielectric layer 28, to a predetermined thickness, to create recesses 16r. Removal of mask layer 32 leaves a completed protective cap 16 attached to its carrier substrate 20, as shown in FIG. 3(b). This figure shows recesses 16r, etched through both adhesive layer 30 and a portion of polyimide layer 28, which will align with an associated air bridge structure 12c when cap 16 is bonded to chip surface 12b. Alternatively, a temporary polymeric film stencil can be used as the temporary "hard" mask 32. The polymeric film may comprise a 2 to 5 mil thick "Kapton" polyimide film, and the appropriate mask openings can be generated by laser cutting. The polymeric mask 32 can be easily attached and removed from the adhesive layer 30.

Figure 3C:
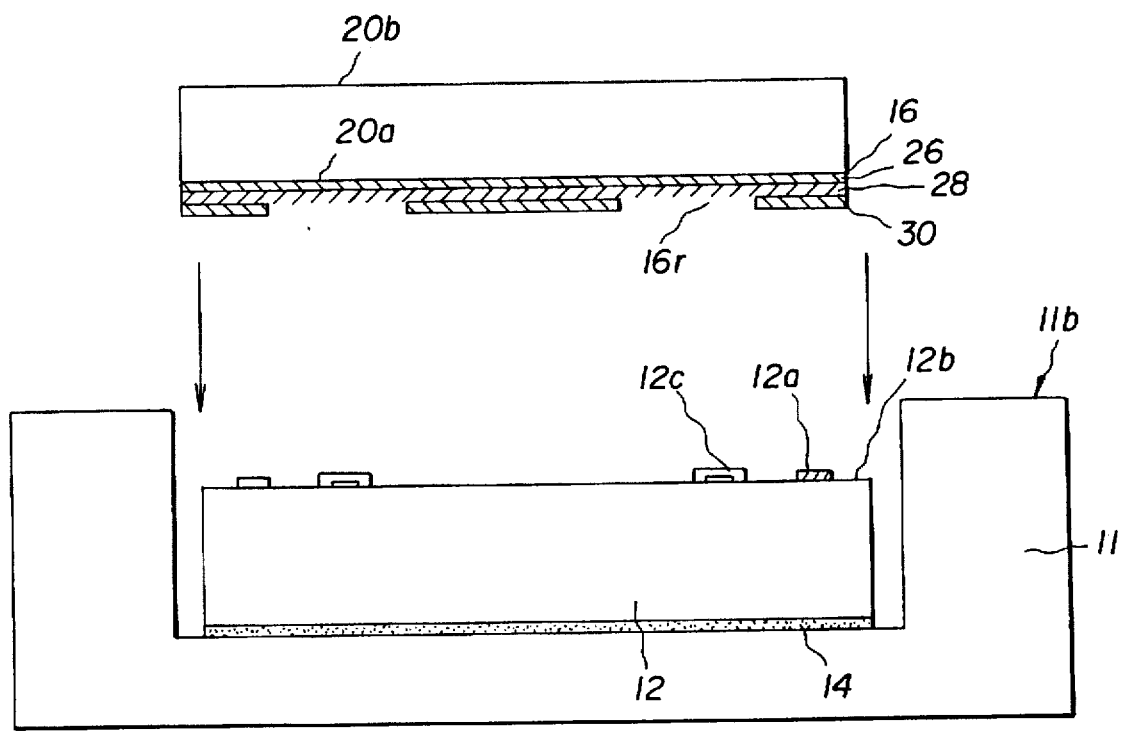

Protective cap 16, attached to carrier substrate 20, is then aligned with multi-chip module substrate 11 such that recesses 16r are aligned with associated air bridge 12c structures, and then bonded to form encapsulating volumes 16v, as shown in FIG. 3(c). This alignment and attachment may be accomplished with any conventional die placement machine. Attachment of protective cap 16 will be accomplished at temperatures and pressures necessary to bond adhesive 30, while maintaining alignment. Adhesive 30 preferably has a melt viscosity which, upon bonding allows formation of a void-free bond between protective cap 16 and chip surface 12b. Adhesive 30 should not be so low in viscosity as to infiltrate air bridge structure 12c.

Carrier substrate 20 is then separated from its protective cap 16 before lamination of the HDI structure 117. This separation is facilitated because release layer 26 was previously disposed between the carrier substrate 20 and polymer layer 28 to increase the efficiency of separation. If carrier layer 20 is quartz, protective cap 16 may be separated by exposing carrier substrate backside 20b to a pulsed excimer laser. UV output of the laser is transmitted through carrier substrate backside 20b and is absorbed at release layer 26, i.e., at interface of the quartz carrier 20a and polyimide 28. For this application, release layer 26 is designed to enhance the absorption of UV radiation. Preferred release layer materials which enhance the absorption of UV radiation are thin films (100 Å) of metals such as titanium, titanium/tungsten, or indium-tin-oxide (ITO). However, any material which enhances UV absorption and does not interfere with the bonding of polyimide 28 to carrier substrate 20 may be utilized. Absorption of UV radiation causes quartz substrate 20 to release from dielectric layer 28, yielding a protective cap 16 bonded to chip 12 and separate from its carrier substrate 20.

If another carrier substrate 20 is utilized, e.g., plastic, metal or ceramic, release layer 26 would comprise a material which would dissolve in a solvent which would not adversely affect the multi-chip module. Examples of this type of release layer 26 are fluorinated polymers, or any other material which dissolves in a solvent which has substantially no adverse affect on module 10.

Figure 3D:
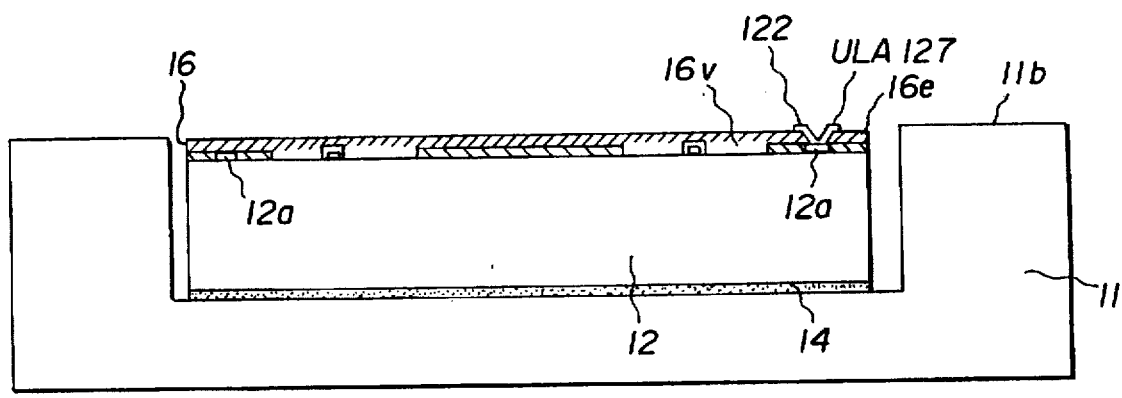

As shown in FIG. 3(d), protective cap top surface 16e is preferably in the same plane as substrate surface 11b. And, as described above, chip well 11a was made deeper to allow for the added thickness of protective cap 16. This design ensures that protective cap 16 has no adverse affects on the HDI structure lamination. Once protective cap 16 is in place, each recess 16r is aligned with and encloses an associated air bridge structure 12c, thereby creating encapsulating volume 16v. Encapsulation volume is large enough to ensure that the protective cap 16 does not interfere with, or impede, the performance of sensitive structure. Irrespective of which protective cap design is utilized, i.e., a first embodiment with conductive posts and solder bumps, or a presently preferred embodiment with via interconnections to the chip pads, it must allow for lamination of a high density interconnect structure.

Referring again to FIG. 1, high density interconnect structure 117 is fabricated above chips 12 and sensitive structures 12c (covered by protective cap 16). Since protective cap top 16e is in the same plane as substrate surface 11b, the lamination of the first dielectric layer is accomplished in any conventional manner.

A first stratum 118 of high density interconnect structure 117 comprises a dielectric layer 120 supporting a patterned metallization layer 122. Dielectric layer 120 has separate lower and upper sublayers 124 and 126, respectively, and supports patterned metallization layer 122 which makes electrical contact with contact pads 12b on substrate 11 within via holes 127 in dielectric layer 120. The lower dielectric sublayer 124 is a thermoplastic adhesive which allows subsequent processing at temperatures below 260° C. As referenced hereinabove, U.S. Pat. No. 5,300,812 teaches a plasticized polyetherimide adhesive, such as "Ultem"/"Benzoflex" (Ultem is a trademark of General Electric Co., Pittsfield, Mass., for a polyetherimide resin, and Benzoflex is a trademark of Velsicol Chemical Corp., Rosemont, Ill., for pentaerythritol tetrabenzoate). Upper dielectric sublayer 126 is preferably a thermoset material (for example, a KAPTON® film). Other materials, including thermoplastics which exhibit sufficient stability, may also be used for the upper dielectric sublayer 126.

As stated above, metallization layer 122 makes electrical contact with at least some contact pads 12a on substrate 11. If the chip pads 12a to be connected are below protective cap 16, the electrical connection must not only be made through dielectric layer 120 but also through protective cap 16. If protective cap 16 comprises a ceramic or glass, electrical interconnection will be made by forming via holes 127 through dielectric layer 120 to make connection with a selected electrical pad 24 on top of cap 16 (see FIG. 2). Pad 24 is electrically connected to chip pad 12a through electrical post 23 in protective cap 16. If, however, the presently preferred protective cap 16 comprising polyimide is utilized, via holes 127 must extend both through dielectric layer 120 and protective cap 16 to make electrical connection with chip pads 12a. Second and higher strata may be formed by conventional techniques, such as those described in above described co-pending application Ser. No. 08/308,886, filed Sep. 19, 1994. As stated in that application, a siloxane polyimide/epoxy (SPIE) adhesive system may be used for these higher strata, as described in commonly assigned U.S. Pat. No. 5,161,093, issued Nov. 3, 1992, to Gorczyca et al, which is herein incorporated by reference in its entirety. In this structure, the SPIE crosslinking copolymer blend adhesive materials used as the lower dielectric sublayer in the second and higher strata are selected so that these adhesive materials become set at a low enough temperature that curing the adhesive materials has no adverse effect on the high density interconnect structure or the electronic components being connected thereby. Correct selection of the curing properties of the adhesive materials allows the structure to be fabricated and, if need be, disassembled and reassembled without an adverse effect on the electronic components being interconnected.

Since protective cap 16 need not be removed from below the high density interconnect structure, there is no need to use any form of removal process for HDI structure 117 to expose cap 16; thus, neither chemical etch nor laser ablation of the high density interconnect structure 117 is necessary. More importantly, there are no limitations placed on the routing of the metallization layers, and in fact, the protective cap provides additional area in which to route metallization. For example, the top and sides of the protective cap may have additional metallization layers which can be patterned to provide alternate circuits for coupling, power or ground planes, etc. Furthermore, the air bridge structure 12c is not exposed to any of the conventional high density interconnect structure removal processes, such as laser ablation and plasma-ashing. This is a significant advantage in producing a highly reliable module.

At this point the fabricated module may be complete; various metallization layers 122, 132, 144 will carry power, ground, and at least one set of signal conductors. And since none of the high density interconnect structure is removed, there are few limitations on how the metallization layers must be routed.

While a presently preferred embodiment of our sensitive-structure-protecting cap is described herein in some detail, many modifications and variations will become apparent to those skilled in the art; it is our intent to be limited only by the scope of the appending claims, and not by the specific details or instrumentalities present herein by way of description of the preferred embodiments(s).

What is claimed is:

1. An electronics module, comprising:
   (1) a substrate, having an upper surface defining a plane, with at least one electronic chip having a surface disposed thereon, said at least one chip having thereon a sensitive air bridge structure and additionally having contact pads;
   (2) a protective cap disposed over and around said sensitive air bridge structure, permanently bonded to said chip, said protective cap comprising:
      (a) a cover-portion having a top surface and a bottom surface;
      (b) a peripheral leg-portion extending from said cover-portion bottom surface to said chip surface, to create an encapsulation volume below said peripheral leg-portion, said volume enclosing said sensitive air bridge structure without any portion of said protective cap contacting said sensitive air bridge structure; and
   (3) a high density interconnect structure disposed over said substrate and said protective cap, having at least one stratum of said high density interconnect structure with a conductive segment which is electrically connected to at least one of said contact pads disposed on said at least one chip.

2. The electronics module according to claim 1, where said at least one chip is disposed in a chip well, and further wherein said cover-portion top surface and said substrate upper surface are in the same plane.

3. The electronics module according to claim 1, where said protective cap is comprised of a material selected from the group consisting of glass, ceramic, and plastic.

4. The electronics module according to claim 2, where said encapsulation volume is substantially devoid of HDI material.

5. An electronics module, comprising:
   (1) a substrate, having an upper surface defining a plane, with at least one electronic chip disposed thereon, said at least one chip having a sensitive air bridge structure and additionally having contact pads;
   (2) means for protecting said sensitive structure; and
   (3) a high density interconnect structure disposed over said substrate and said protecting means, having at least one stratum of said high density interconnect structure with a conductive segment which is electrically connected to at least one of said contact pads disposed on said at least one chip.

6. The electronics module according to claim 5, where said at least one chip is disposed in a chip well, and further where said protecting means comprises a protective cap with a top which is in said substrate upper surface plane.

7. The electronics module according to claim 6, where said protective means comprises a protective cap which is comprised of a material selected from the group consisting of glass, ceramic, and plastic.

8. A cap for protecting a sensitive air bridge structure fabricated above a surface of a semiconductor device, comprising:
   a cover-portion formed of an insulative material and having a top surface, a bottom surface and a periphery; and
   at least one leg-portion extending from the periphery of said cover-portion bottom surface, where said leg-portion includes means for adhesion to said device surface, said at least one leg-portion formed to cooperate with said top-portion to define a recess, said recess having dimensions sufficient to enclose and protect said sensitive air bridge structure without any portion of said protective cap contacting said sensitive air bridge structure.

9. The protective cap according to claim 8, where said protective cap is comprised of a material selected from the group consisting of glass, ceramic, and plastic.

* * * * *